US008354286B2

(12) United States Patent
Lee et al.

(10) Patent No.: US 8,354,286 B2
(45) Date of Patent: *Jan. 15, 2013

(54) METHOD OF MANUFACTURING SILICON OPTOELECTRONIC DEVICE, SILICON OPTOELECTRONIC DEVICE MANUFACTURED BY THE METHOD, AND IMAGE INPUT AND/OR OUTPUT APPARATUS USING THE SILICON OPTOELECTRONIC DEVICE

(75) Inventors: Eun-kyung Lee, Gyeonggi-do (KR); Byoung-lyong Choi, Seoul (KR); Pil-soo Ahn, Gyeonggi-do (KR); Jun-young Kim, Gyeonggi-do (KR); Young-gu Jin, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2179 days.

This patent is subject to a terminal disclaimer.

(21) Appl. No.: 10/758,136

(22) Filed: Jan. 16, 2004

(65) Prior Publication Data

US 2004/0227140 A1 Nov. 18, 2004
US 2012/0161159 A9 Jun. 28, 2012

Related U.S. Application Data

(63) Continuation-in-part of application No. 10/122,421, filed on Apr. 16, 2002, now Pat. No. 6,930,330.

(30) Foreign Application Priority Data

Jan. 10, 2002 (KR) .................. 10-2002-0001431
Jan. 17, 2003 (KR) .................. 10-2003-0003259

(51) Int. Cl.
*H01L 21/00* (2006.01)
(52) U.S. Cl. .................. 438/29; 438/39; 438/57

(58) Field of Classification Search .................. 438/29, 438/39, 57
See application file for complete search history.

(56) References Cited

U.S. PATENT DOCUMENTS

| 4,684,964 A | * | 8/1987 | Pankove et al. .................. 257/86 |
| 5,324,965 A | * | 6/1994 | Tompsett et al. .............. 257/103 |
| 5,514,620 A | * | 5/1996 | Aoki et al. .................... 438/565 |
| 5,607,876 A | * | 3/1997 | Biegelsen et al. ............... 438/45 |
| 5,726,440 A | * | 3/1998 | Kalkhoran et al. ......... 250/214.1 |
| 6,566,595 B2 | * | 5/2003 | Suzuki .......................... 136/255 |

(Continued)

*Primary Examiner* — Laura Menz
(74) *Attorney, Agent, or Firm* — Harness, Dickey & Pierce, P.L.C.

(57) ABSTRACT

A method of manufacturing a silicon optoelectronic device, a silicon optoelectronic device manufactured by the method, and an image input and/or output apparatus including the silicon optoelectronic device are provided. The method includes preparing an n- or p-type silicon-based substrate, forming a microdefect pattern along a surface of the substrate by etching, forming a control film with an opening on the microdefect pattern, and forming a doping region on the surface of the substrate having the microdefect pattern in such a way that a predetermined dopant of the opposite type to the substrate is injected onto the substrate through the opening of the control film to be doped to a depth so that a photoelectric conversion effect leading to light emission and/or reception by quantum confinement effect in the p-n junction occurs. The silicon optoelectronic device has superior light-emitting efficiency, can be used as at least one of a light-emitting device and a light-receiving device, and has high wavelength selectivity. In addition, the silicon optoelectronic device panel having the two-dimensional array of the silicon optoelectronic devices can be applied in the image input and/or output apparatus capable of directly displaying an image and/or inputting optical information in a screen.

27 Claims, 16 Drawing Sheets

U.S. PATENT DOCUMENTS

| | | | |
|---|---|---|---|
| 6,930,330 B2* | 8/2005 | Choi et al. | 257/87 |
| 7,253,491 B2* | 8/2007 | Lee et al. | 257/461 |
| 7,537,956 B2* | 5/2009 | Song et al. | 438/57 |
| 7,670,862 B2* | 3/2010 | Song et al. | 438/57 |
| 7,750,353 B2* | 7/2010 | Lee et al. | 257/79 |
| 7,754,508 B2* | 7/2010 | Lee et al. | 438/29 |
| 8,008,102 B2* | 8/2011 | Vinciguerra et al. | 438/32 |
| 8,101,901 B2* | 1/2012 | Toda | 250/214.1 |
| 2003/0127655 A1 | 7/2003 | Choi et al. | |
| 2004/0227140 A1* | 11/2004 | Lee et al. | 257/79 |
| 2006/0115916 A1* | 6/2006 | Lee et al. | 438/29 |
| 2006/0252171 A1* | 11/2006 | Lee et al. | 438/39 |
| 2012/0161159 A9* | 6/2012 | Lee et al. | 257/79 |

* cited by examiner

US 8,354,286 B2

METHOD OF MANUFACTURING SILICON OPTOELECTRONIC DEVICE, SILICON OPTOELECTRONIC DEVICE MANUFACTURED BY THE METHOD, AND IMAGE INPUT AND/OR OUTPUT APPARATUS USING THE SILICON OPTOELECTRONIC DEVICE

This application claims the priority from Korean Patent Application No. 2003-3259, filed on Jan. 17, 2003, in the Korean Intellectual Property Office, the disclosure of which is incorporated herein in its entirety by reference.

This application is a continuation-in-part of application Ser. No. 10/122,421 entitled "Silicon Optoelectric Device and Light Emitting Apparatus Using the Same", filed on Apr. 16, 2002, now U.S. Pat. No. 6,930,330.

BACKGROUND OF THE INVENTION

1. Field of the Invention

The present invention relates to a method of manufacturing a silicon optoelectronic device, a silicon optoelectronic device manufactured by the method, and an image input and/or output apparatus having the silicon optoelectronic device.

2. Description of the Related Art

An advantage of using a silicon semiconductor substrate is that it provides excellent reliability and allows highly integrated density of a logic device, an operation device, and a drive device on the substrate. Also, a silicon semiconductor material can be used in fabrication of a highly integrated circuit at much lower cost than a compound semiconductor material, due to the use of inexpensive silicon. That is why many integrated circuits use silicon as their basic material.

In this regard, studies on fabrication of silicon-based light-emitting devices have been continued to compatibly use them in fabrication of integrated circuits and to obtain inexpensive photoelectronic devices. It has been demonstrated that porous silicon and nano-crystal silicon have light emission characteristics.

FIG. 1 depicts the section of a porous silicon region formed at a bulk monocrystalline silicon surface, and an energy band gap between the valence band and the conduction band of the porous silicon region.

Porous silicon is the result of anodic electrochemical dissolution of the surface of bulk monocrystalline silicon, for example, in an electrolyte solution containing a hydrofluoric acid (HF).

When bulk silicon is subjected to anodic electrochemical dissolution in a HF solution, a porous silicon region 70 having numerous pores 70a is formed at the surface of the bulk silicon, as shown in FIG. 1. The pores 70a have more Si—H bonds, relative to intact areas 70b which have not been dissolved by a HF solution. The energy band gap between the valence band energy (Ev) and the conduction band energy (Ec) of the porous silicon region 70 has a shape contrasting to the porous silicon region 70.

Depressions between prominences in energy bands, i.e., the intact areas 70b between the pores 70a in the porous silicon region 70 exhibits a quantum confinement effect. Therefore, the energy band gap of the depression becomes larger than that of the bulk silicon, and electrons and holes are trapped in the intact areas 70b, thereby inducing light-emitting recombination.

For example, in the porous silicon region 70, when the intact areas 70b between the pores 70a are formed in the shape of monocrystalline silicon wires that exhibit a quantum confinement effect, electrons and holes are trapped in the wires, thereby inducing light-emitting recombination. A light-emitting wavelength can vary from a near-infrared light area to a blue light area wavelength according to the sizes (widths and lengths) of the wires. In this case, the period of the pores 70a may be about 5 nm and the maximal thickness of the porous silicon region may be 3 nm, as shown in FIG. 1.

Therefore, when a predetermined voltage is applied to monocrystalline silicon having the porous silicon region 70 in a porous silicon based light-emitting device, light of a predetermined wavelength band can be emitted according to porosity.

However, a porous silicon based light-emitting device as described above does not yet provide reliability as a light-emitting device and exhibits external quantum efficiency (EQE) as low as 0.1%.

FIG. 2 is a schematic sectional view of an example of a nano-crystal silicon light-emitting device.

Referring to FIG. 2, a nano-crystal silicon light-emitting device comprises a stacked structure of a p-type monocrystalline silicon substrate 72, an amorphous silicon layer 73 formed on the substrate 72, an insulator 75 formed on the amorphous silicon layer 73, and lower and upper electrodes 76 and 77 formed on the lower surface of the substrate 72 and the upper surface of the insulator 75, respectively. Nano-crystal silicon quantum dots 74 are formed in the amorphous silicon layer 73.

When the amorphous silicon layer 73 is recrystallized by rapid heat treatment at 700° C. under an oxygen atmosphere, the nano-crystal silicon quantum dots 74 are formed. In this case, the amorphous silicon layer 73 has a thickness of 3 nm and the nano-crystal silicon quantum dots 74 have a diameter of about 2 to 3 nm.

In a light-emitting device using the nano-crystal silicon quantum dots 74 as described above, when a reverse voltage is applied across the upper and lower electrodes 77 and 76, a high electric field is generated at both ends of the amorphous silicon layer between the silicon substrate 72 and the nano-crystal silicon quantum dots 74, thereby generating electrons and holes of high-energy states. Therefore, the tunneling of the generated electrons and holes into the nano-crystal silicon quantum dots 74 occurs, thereby resulting in light-emitting recombination. In this case, a light-emitting wavelength in a light-emitting device using the nano-crystal silicon quantum dots 74 decreases as the sizes of the nano-crystal silicon quantum dots decrease.

However, light-emitting devices using the nano-crystal silicon quantum dots 74 have problems in that it is difficult to control the sizes of the nano-crystal silicon quantum dots and to obtain the uniformity of the nano-crystal silicon quantum dots, and light-emitting efficiency is very low.

SUMMARY OF THE INVENTION

The present invention provides a method of manufacturing a silicon optoelectronic device which has excellent light-emitting efficiency, can be used as at least one of a light-emitting device and a light-receiving device, and has high wavelength selectivity. The present invention also provides a silicon optoelectronic device manufactured by the method and an image input and/or output apparatus used the silicon optoelectronic device.

According to an aspect of the present invention, there is provided a method of manufacturing a silicon optoelectronic device comprising: preparing an n- or p-type silicon-based substrate; forming a microdefect pattern along a surface of the substrate by etching; forming a control film with an opening on the microdefect pattern and forming a doping region on the surface of the substrate having the microdefect pattern in such a way that a predetermined dopant of the opposite type to the substrate is injected onto the substrate through the opening of the control film to be doped to a depth so that a photoelectric conversion effect leading to light emission and/or reception by quantum confinement effect in a p-n junction occurs.

Forming the microdefect pattern may comprise: forming a mask layer on the surface of the substrate; forming openings of a desired size and period in the mask layer; etching the surface of the substrate corresponding to the openings of the mask layer to form the microdefect pattern along the surface of the substrate; and removing the mask layer.

Forming the openings of a desired size and period in the mask layer may be carried out using a single probe or a multi-probe having an array of a plurality of probes.

The probe may be an atomic force microscopy (AFM) probe.

The control film may be a silicon oxide film to allow the doping region to be formed to the depth such that a photo-electrical conversion effect by quantum confinement in the p-n junction between the doped region and the substrate occurs.

The microdefect pattern may have a period corresponding to the wavelength of light emitted and/or received.

The microdefect pattern may be formed to a single period to emit and/or receive light of a single wavelength.

When the control film is formed with a plurality of openings on the microdefect pattern and a plurality of doping regions are formed through the openings, an array of a plurality of silicon optoelectronic devices may be obtained.

When the microdefect pattern is formed to a plurality of microdefect pattern regions having different periods, the control film is formed with a plurality of openings corresponding to the periods, and a plurality of doping regions are formed through the openings, an array of a plurality of silicon optoelectronic devices that emit and/or receive light of a plurality of wavelengths may be obtained.

According to another aspect of the present invention, there is provided a silicon optoelectronic device manufactured by at least one of the methods as described above.

According to yet another aspect of the present invention, there is provided an image input and/or output apparatus comprising a silicon optoelectronic device panel having a two-dimensional array of silicon optoelectronic devices, each of which inputs and/or outputs an image, formed on an n- or p-type silicon-based substrate, each of the silicon optoelectronic devices comprising: a microdefect pattern formed along a surface of the substrate by etching; and a doping region formed on the surface of the substrate having the microdefect pattern using a predetermined dopant of the opposite type to the substrate to be doped to a depth so that a photoelectric conversion effect leading to light emission and/or reception by quantum confinement effect in a p-n junction occurs.

When both input and output of an image are possible, some of the silicon optoelectronic devices may input an image and the others of the silicon optoelectronic devices may output an image.

When both input and output of an image are possible, each of the silicon optoelectronic devices may input and output an image.

Electrodes may be patterned on the substrate to carry out the input and/or output of an image from the silicon optoelectronic device panel on a pixel-by-pixel basis.

The silicon optoelectronic device panel may comprise three or more of the silicon optoelectronic devices per each pixel.

In this case, the three or more of the silicon optoelectronic devices corresponding to each pixel may have the microdefect patterns of different periods and may emit and/or receive light of different wavelengths to represent a color image.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present applicant has suggested a silicon optoelectronic device having an ultra-shallow doping region to form a quantum structure in a p-n junction of a silicon-based substrate under U.S. patent application Ser. No. 10/122,421 filed on Apr. 16, 2002, titled "silicon optoelectronic device and light-emitting apparatus using the same". In the silicon optoelectronic device disclosed in the above application, surface flections, i.e., microdefects of a desired size and period that serve to increase wavelength selectivity are self-assembled under a specific oxidation condition and a specific diffusion process. For this reason, uniform formation and reproduction of the surface flections are very difficult.

As mentioned in the above application, the wavelength of a silicon optoelectronic device having light reception and/or emission characteristics by a quantum structure formed by an ultra-shallow diffusion process is determined by microflections formed along a surface of the silicon optoelectronic device. In this regard, in order to select a desired wavelength band, the microflections having a desired size must be arrayed in a desired period.

A silicon optoelectronic device according to the present invention is characterized in that a desired flection structure, i.e., a microdefect pattern is artificially formed by controlling the surface shape of the silicon optoelectronic device to thereby increase the selectivity of a desired wavelength band, unlike in the above application in which flections are self-assembled along a surface of a silicon optoelectronic device during the fabrication of the silicon optoelectronic device. Of course, a silicon optoelectronic device according to the present invention can both emit and receive light, like the silicon optoelectronic device disclosed in the above application.

A selected wavelength band and the degree of amplification are determined by the sizes and shapes of surface flections, and the gap between the surface flections, i.e., the period of the surface flections. In this regard, when the pattern of the surface protrusions is optimized according to the applications of silicon optoelectronic devices, light-emitting efficiency can be increased. Further, only light of a specific wavelength band can be efficiently emitted and/or received.

FIGS. 3 through 6 show processes of manufacturing a silicon optoelectronic device according to an embodiment of the present invention.

Figure 1:
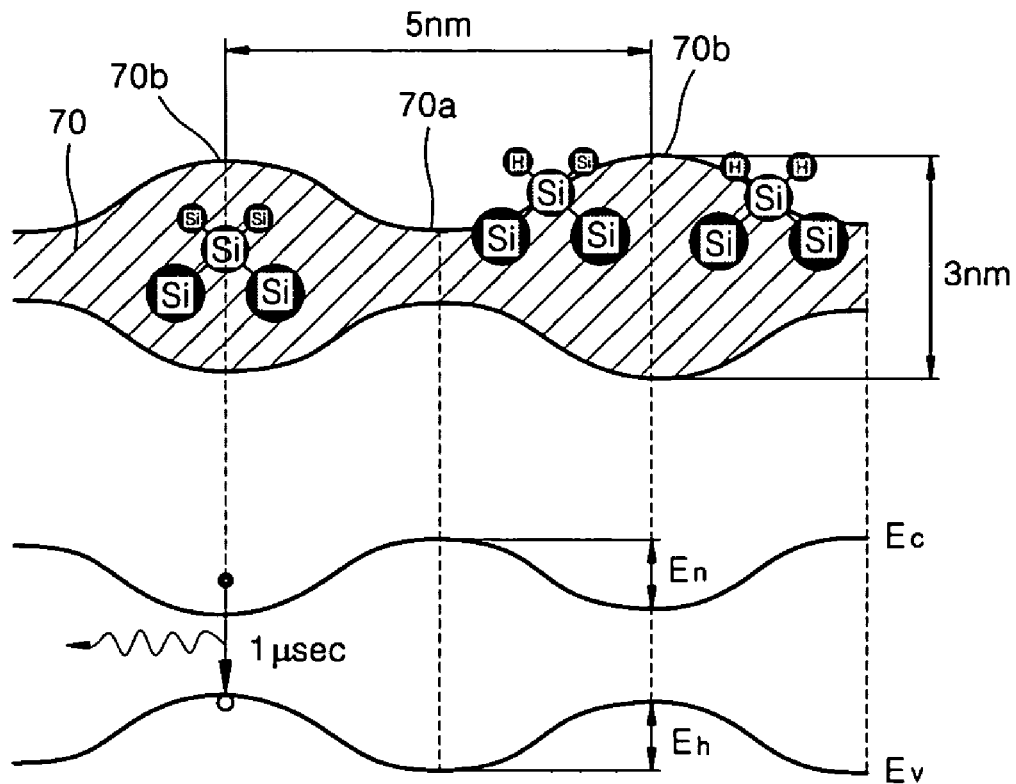
FIG. 1 depicts the section of a porous silicon region formed at a bulk monocrystalline silicon surface and an energy band gap between the valence band and the conduction band of the porous silicon region.
Figure 2:
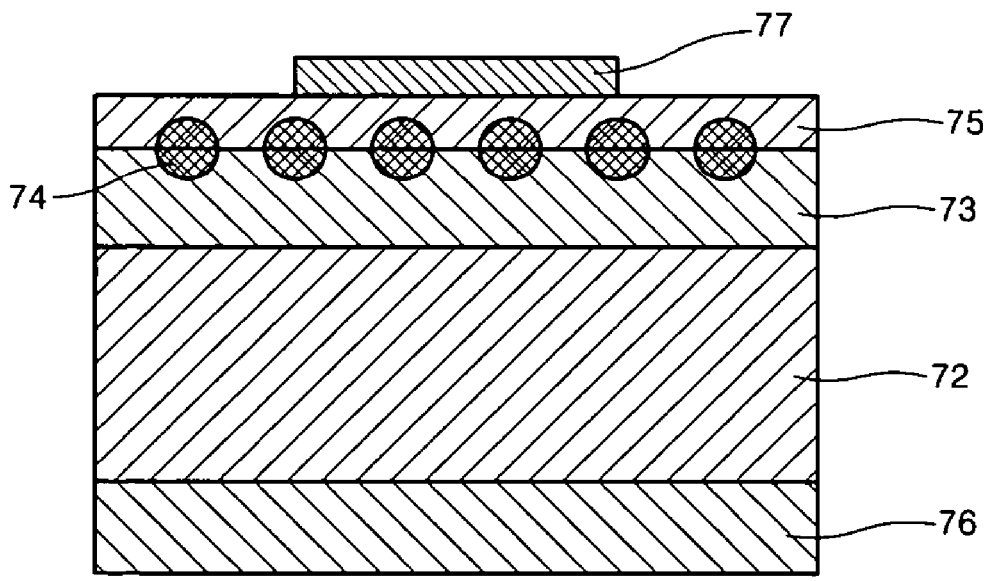
FIG. 2 is a schematic sectional view of an example of a nano-crystal silicon light-emitting device.
Figure 3:
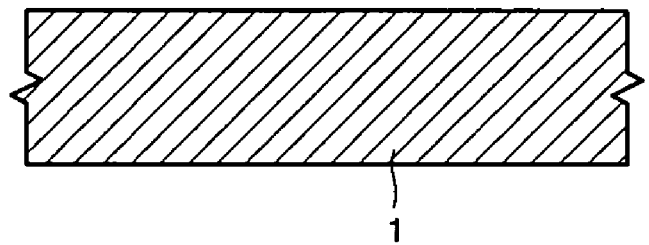
FIGS. 3 through 6 depict processes of manufacturing a silicon optoelectronic device according to an embodiment of the present invention.

Referring to FIG. 3, first, an n- or p-type silicon-based substrate 1 is prepared. The substrate 1 is made of a predetermined semiconductor material containing silicon (Si), for example, Si, SiC, or diamond, and is doped to an n-type.

Next, a microdefect pattern 7 is artificially formed to a desired size, shape, and period along a surface of the substrate 1 by etching, as shown in FIGS. 4A through 4E. Openings 5 have been exaggerated in FIG. 4B and the microdefect pattern 7 has been exaggerated in FIGS. 4C through 4E and FIG. 12 as will be described later.

FIGS. 4A through 4E show an example of a method of forming surface flections to a desired shape and size.

Figure 4A:
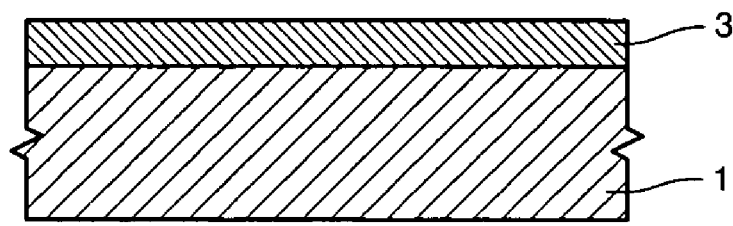

In order to artificially form the microdefect pattern 7, first, a mask layer 3 is formed on a surface of the prepared substrate 1, as shown in FIG. 4A. The mask layer 3 is formed by coating a photoresist layer of a desired thickness on the surface of the substrate 1, followed by hard baking.

Figure 4B:
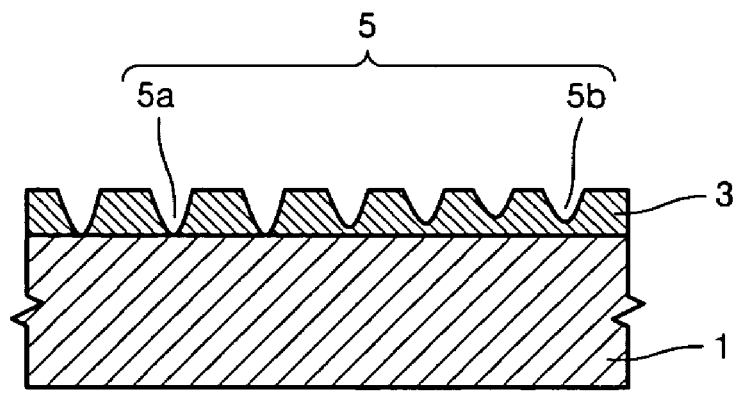

Next, the openings 5 of a desired size and period are formed in the mask layer 3, as shown in FIG. 4B.

The openings 5 may be formed using an atomic force microscopy (AFM) probe.

The AFM is a type of a scanning probe microscopy (SPM) that can obtain stereoscopic information about the surface structure of a matter and can relatively easily obtain information about atomic arrangements of surfaces even to angstrom (Å) levels. The AFM can obtain three-dimensional surface information by scanning a matter surface in two-dimensions using a small and sharp probe called as a tip. The AFM uses a principle of imaging a spatial distribution of the height of a probe while keeping constant a repulsive force between the probe and the sample surface, i.e., a distance between the probe and the sample surface. Since a repulsive force is a force that acts generally on all matters, the AFM can also be applied in an insulator which does not transmit electricity.

When the AFM is used in the formation of the openings 5 in the mask layer 3 instead of surface information detection, the openings 5 of a desired size and period can be patterned.

In the formation of the openings 5 in the mask layer 3, an AFM having a single probe or an AFM having multi-probe being a one-dimensional or two-dimensional array of a plurality of probes may be used.

Figure 7:
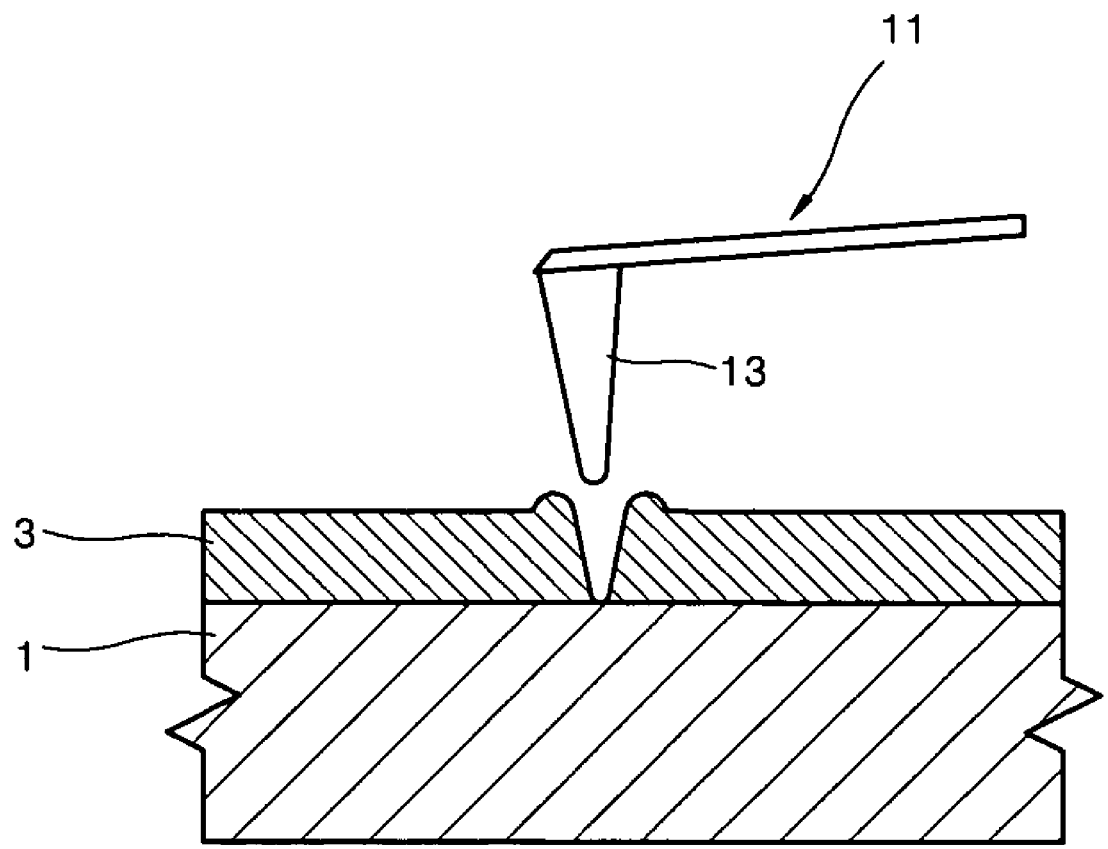
FIG. 7 is a schematic view showing a principle of forming an opening in a mask layer using an atomic force microscopy (AFM) probe.

FIG. 7 schematically shows a principle of forming the openings 5 in the mask layer 3 using an AFM probe 11. When a tip 13 of the AFM probe 11 moves in top and bottom directions at least once or more, the openings 5 of a desired depth can be formed on the mask layer 3.

Figure 8A:
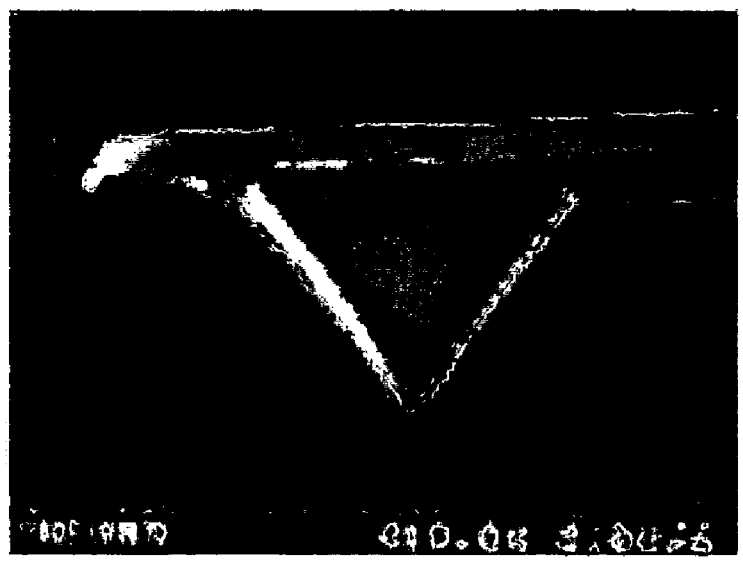
FIGS. 8A and 8B depict various tips used in the AFM probe.
Figure 8B:
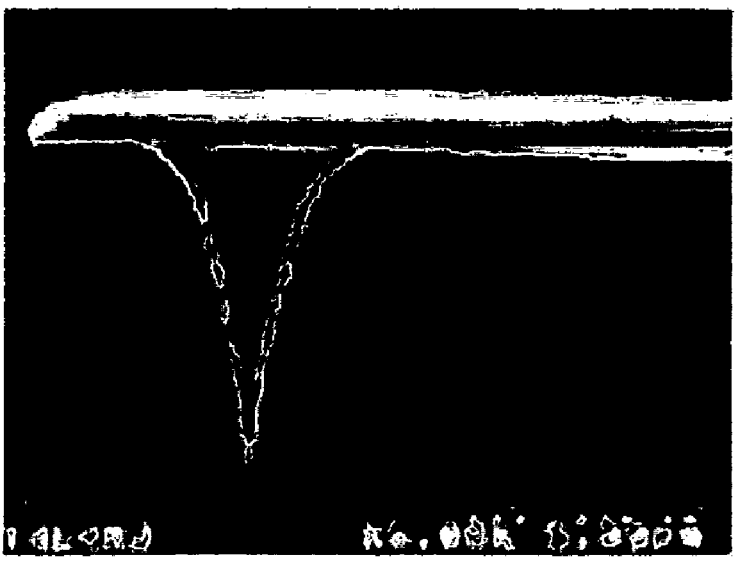

FIGS. 8A and 8B show various tips used in the AFM probe 11. The shapes of the openings 5 formed in the mask layer 3 vary depending on the shape of the tip.

Figure 9:
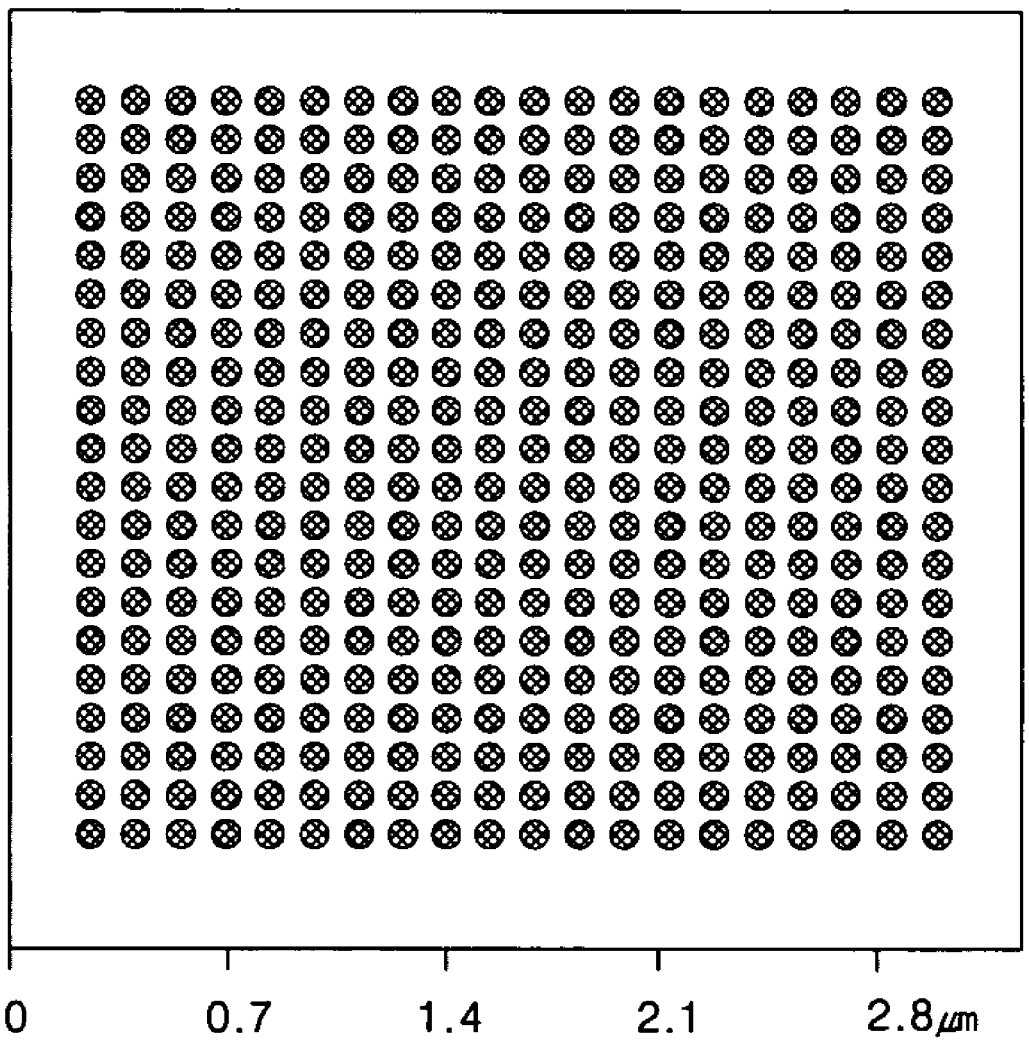
FIG. 9 is a schematic view of patterned openings formed in a mask layer using an AFM single probe or an AFM multi-probe.

A multi-probe cantilever having a one-dimensional array of a plurality of AFM probes 11 or a multi-probe cantilever having a two-dimensional array of a plurality of AFM probes 11 may be used to form the openings 5 in the mask layer 3. FIG. 9 schematically shows the openings 5 formed in the mask layer 3 using an AFM having a single probe or multi-probes.

An AFM having multi-probes can facilitate a process and can provide a uniform opening pattern.

Referring again to FIG. 4B, using an AFM having a single probe or multi-probes can form the openings 5 of a desired depth, shape, and period in the mask layer 3.

In order to obtain a silicon optoelectronic device of a single wavelength band, the openings 5 are formed to a single period. In this case, the silicon optoelectronic device emits and/or receives only light of a specific wavelength band. On the other hand, in order to obtain a silicon optoelectronic device of a plurality of wavelength bands, for example, for white light, the openings 5 are formed to different periods corresponding to the wavelength bands. In this case, the silicon optoelectronic device emits and/or receives light of a plurality of wavelength bands.

The shapes of flections formed by etching can vary according to the depths of the openings 5 formed in the mask layer 3. FIG. 4B shows that deep openings 5a are formed in some areas of the mask layer 3 and shallow openings 5b are formed in the remaining areas of the mask layer 3.

In this case, the depth, shape, and period of the openings 5 are selected according to a desired wavelength.

Figure 4C:
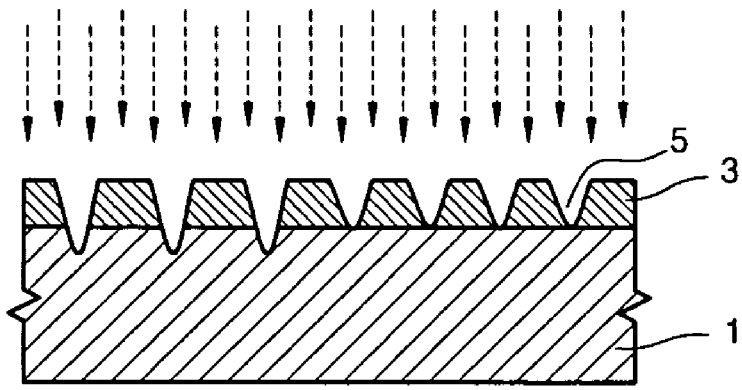
Figure 4D:
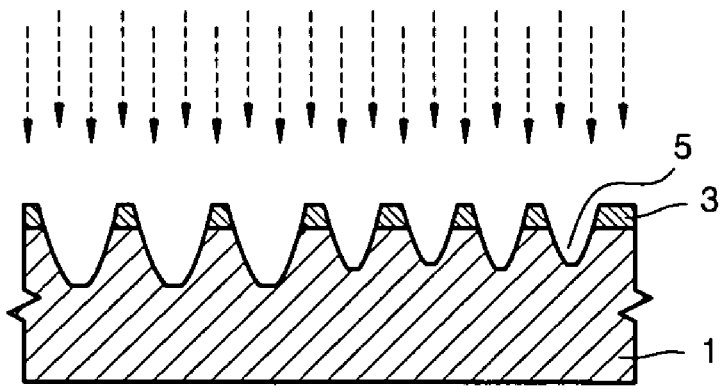

After forming the openings 5 of a desired depth, shape, and period in the mask layer 3 as described above, when etching is carried out as shown in FIGS. 4C and 4D, a micro-flection pattern, i.e., the microdefect pattern 7 is formed. Preferably, a dry etching process is used. A wet etching process may also be used.

Thin photoresist areas, i.e., the portions formed the deep openings 5a are etched and opened faster than thick photoresist areas, i.e., the portions formed the shallow openings 5b. Exposed portions of the substrate 1 corresponding to the openings are also etched during the etching, thereby creating a flectional surface of the substrate 1. Therefore, the microdefect pattern 7 is artificially formed along the surface of the substrate 1.

In this case, the surface of the substrate 1 corresponding to the deep openings 5a of the mask layer 3 is etched deeply and widely, thereby forming flections having a triangular peak shape (similar to a cone or a polygonal pyramid as viewed in three-dimensions). On the other hand, the surface of the substrate 1 corresponding to the shallow openings 5b of the mask layer 3 is etched shallowly and narrowly, thereby forming flections having a trapezoidal peak shape (similar to a truncated cone or a truncated polygonal pyramid as viewed in three-dimensions).

Figure 10:
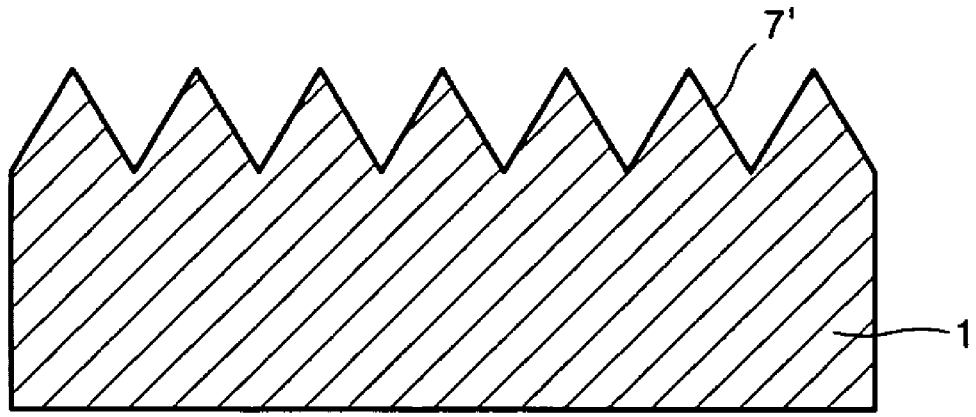
FIG. 10 is a schematic view of a microdefect pattern having triangular protrusions formed along a surface of a substrate, i.e., a triangular microdefect pattern, as viewed in two dimensions.
Figure 11:
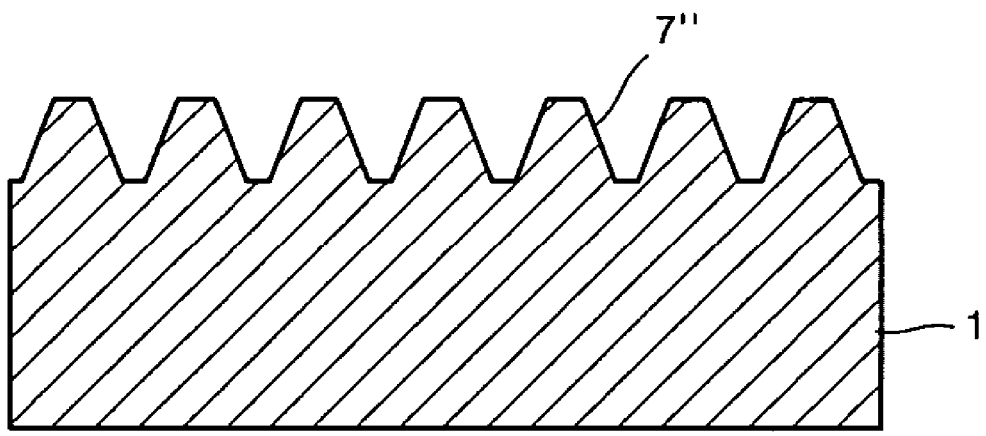
FIG. 11 is a schematic view of a microdefect pattern having trapezoidal protrusions formed along a surface of a substrate, as viewed in two dimensions.

FIG. 10 is a schematic view of flections, i.e., a microdefect pattern 7' having a triangular peak shape formed along a surface of the substrate 1, as viewed in two dimensions. FIG. 11 is a schematic view of a microdefect pattern 7'' having a trapezoidal peak shape formed along a surface of the substrate 1, as viewed in two dimensions.

As described above, by varying the depths of the openings 5 formed in the mask layer 3, the depth and peak shape of the flections can vary. Here, the peak shapes of the flections can vary depending on the etching depth, the shape, size, and/or period of the openings 5, in addition to the depths of the openings 5 formed in the mask layer 3.

The wavelength of light emitted and/or received is determined by the period of the flections, i.e., the period of the microdefect pattern 7 formed along the surface of the substrate 1. Light field strength characteristics according to a wavelength vary according to the shape and period of the flections.

In this regard, when the period and shape of the flections are optimized, a desired wavelength and desired field strength characteristics can be obtained.

Figure 4E:
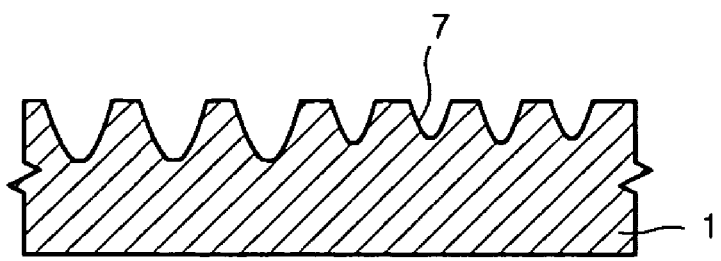

When the mask layer 3 is removed after the above-described etching, preferably, dry etching is terminated, the surface of the substrate 1 having the microdefect pattern 7 is exposed, as shown in FIG. 4E.

Since the shape, period, and depth of the microdefect pattern 7 can be controlled during the processes as shown in FIGS. 4A through 4E, a desired wavelength can be controlled.

If the period of the microdefect pattern 7, i.e., the lengths of microcavities, are long, long wavelength light is amplified. On the other hand, if the lengths of the microcavities are short, short wavelength light is amplified.

In this regard, when the lengths of the microcavities inducing a desired wavelength and a resonance are designed, a silicon optoelectronic device having enhanced optical efficiency relative to the silicon optoelectronic device having self-assembled microcavities disclosed in U.S. patent application Ser. No. 10/122,421 as described above can be obtained.

Further, when the lengths of the microcavities inducing a desired wavelength and a resonance are designed so that amplification and/or absorption of desired wavelength light is carried out, for example, on a pixel-by-pixel basis on a silicon-based wafer, an array of silicon optoelectronic devices for a high efficiency image input and/or output apparatus as will be described later can be obtained.

Figure 5A:
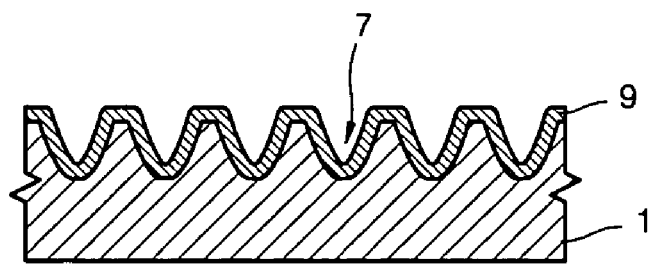
Figure 5B:
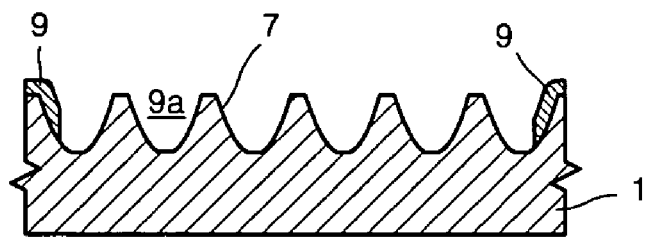

Next, on the microdefect pattern 7 formed along the surface of the substrate 1 by the processes shown in FIGS. 4A through 4E, a control film 9 having an opening 9a is formed as shown in FIGS. 5A and 5B. While FIGS. 5A and 5B show the microdefect pattern 7 formed to a single period, the microdefect patterns of different periods can be formed when needed as shown in the processes of FIGS. 4B through 4E, to thereby emit and/or receive light of a plurality of wavelengths.

Preferably, the control film 9 is a silicon oxide ($SiO_2$) film with an appropriate thickness so that a doping region is formed to an ultra-shallow doping depth. For example, the control film 9 can be patterned in such a way that a $SiO_2$ film is formed on the microdefect pattern 7 as shown in FIG. 5A and then etched by a photolithography process to form the opening 9a for a diffusion process. The control film thus patterned has a mask structure as shown in FIG. 5B.

Preferably, the $SiO_2$ film is formed by a dry oxidation process. Since the dry oxidation process is carried out for a long duration, the substrate 1 can have good surface flections.

The control film 9 acts as a mask in the formation of the doping region so that the doping region can be formed to an ultra-shallow depth. The control film 9 may be removed after the formation of the doping region.

Figure 6:
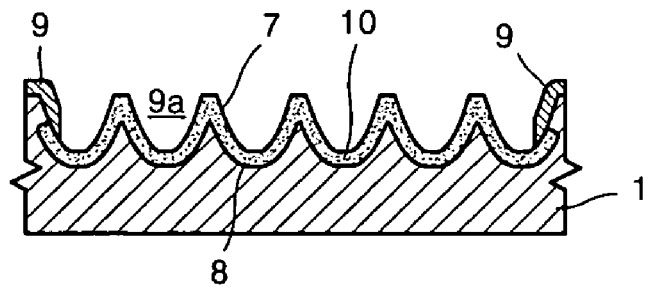

Next, the doping region 10 is formed to an ultra-shallow depth in the surface of the substrate 1 having the microdefect pattern 7 in such a way that a predetermined dopant of the opposite type to the substrate 1 is injected into the substrate 1 through the opening 9a of the control film 9, as shown in FIG. 6.

When a predetermined dopant such as boron and phosphorus is injected into the substrate 1 through the opening 9a of the control film 9 by a non-equilibrium diffusion process (for example), the doping region 10 is ultra-shallowly doped with the opposite type to the substrate 1, for example, a p+ type, along the texture of the microdefect pattern 7. At the same time, a p-n junction 8 having a quantum structure is formed at an interface between the doping region 10 and the substrate 1.

Although a non-equilibrium diffusion process is used herein for the formation of the ultra-shallow doping region 10, another processes such as an implantation process can also be used provided that the doping region 10 can be formed to a desired shallow depth.

The substrate 1 may be doped to a p type and the doping region 10 may be doped to an n+ type.

As described above, when a doping process is controlled so that the doping region 10 can be formed to an ultra-shallow depth, a quantum structure comprised of at least one of quantum wells, quantum dots, and quantum wires is formed at an interface between the doping region 10 and substrate 1, i.e., the p-n junction 8. Therefore, the quantum confinement effect occurs at the p-n junction 8, thereby expressing the photoelectric conversion effect.

Quantum wells are mostly formed at the p-n junction 8. Quantum dots or quantum wires may also be formed. A composite structure comprised of two or more types of quantum wells, quantum dots, and quantum wires may also be formed at the p-n junction 8. Since the quantum structure formed at the p-n junction 8 is disclosed in the above-described patent application, the detailed descriptions thereof will be omitted.

At the quantum structure of the p-n junction 8, doping portions of opposite conductivity types alternate with each other. Wells and barriers may be about 2 and 3 nm thick, respectively.

Such ultra-shallow doping for forming the quantum structure at the p-n junction 8 can be accomplished by optimally controlling the thickness of the control film 9 and the conditions of a diffusion process.

The thickness of a diffusion profile can be adjusted to 10-20 nm (for example) by an appropriate diffusion temperature and a deformed potential due to the microdefect pattern 7 formed along the surface of the substrate 1 during a diffusion process. The quantum structure is created by the ultra-shallow diffusion profile thus formed.

As well known in the field of the diffusion technology, when a $SiO_2$ film is thicker than an appropriate thickness (e.g. several thousand angstroms) or a diffusion temperature is low, vacancies mainly affect diffusion, thereby causing a deep diffusion. On the other hand, when a $SiO_2$ film is thinner than an appropriate thickness or the diffusion temperature is low, Si self-interstitials mainly affect diffusion, thereby causing a deep diffusion. Therefore, when a $SiO_2$ film is formed to an appropriate thickness in which the Si self-interstitials and the vacancies are generated at a similar ratio, combination of the Si self-interstitials and the vacancies retards dopant diffusion. As a result, an ultra-shallow doping is accomplished. The physical properties of the vacancies and the self-interstitials as used herein are well disclosed in the field of the diffusion technology, and thus, the detailed descriptions thereof will be omitted.

When the control film 9 is formed with a plurality of openings 9a on the microdefect pattern 7 and a plurality of doping regions 10 are formed through the openings 9a, an array of a plurality of silicon optoelectronic devices can be obtained.

When the microdefect pattern 7 is formed to different periods, the control film 9 is formed with a plurality of openings 9a corresponding to the periods, and a plurality of doping regions 10a are formed through the openings 9a, an array of a plurality of silicon optoelectronic devices that emit and/or receive light of a plurality of wavelengths can be obtained.

Figure 12:
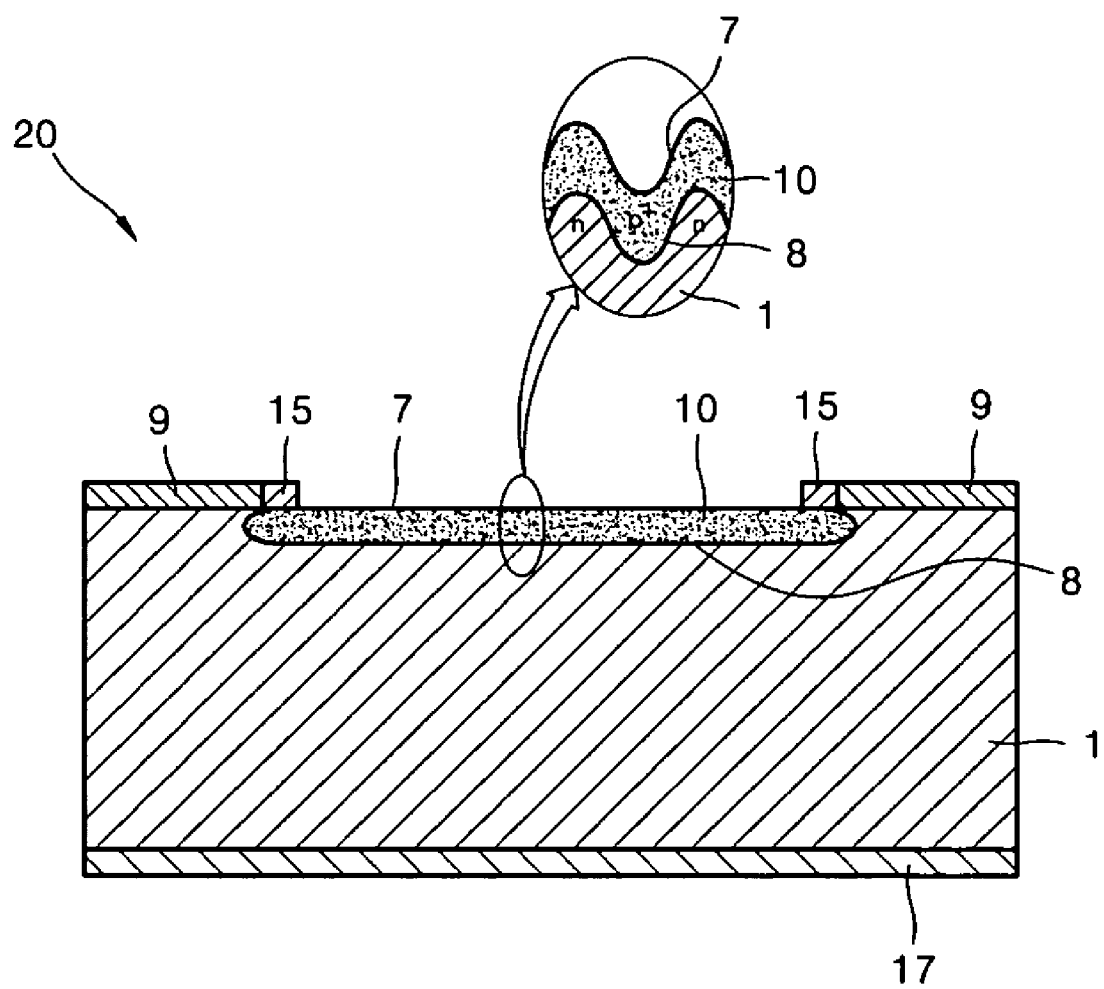
FIG. 12 is a schematic sectional view of a silicon optoelectronic device according to an embodiment of the present invention.

Further, when an electrode pattern is formed on the substrate 1 to be electrically connected to the doping region 10 thus formed, a silicon optoelectronic device 20 shown in FIG. 12 is obtained.

Referring to FIG. 12, a first electrode 15 is formed at the same surface of the substrate 1 as at which the doping region 10 is formed and a second electrode 17 is formed on the lower surface of the substrate 1. The same reference numerals as in the above-described drawings indicate substantially the same constitutional elements. FIG. 12 shows that the first electrode 15 made of an opaque metal is formed in such a way to be in contact with external sides of the doping region 10. The first electrode 15 may also be made of a transparent electrode material such as indium tin oxide (ITO). In this case, the first electrode 15 may be formed on the entire surface of the doping region 10.

As shown in FIG. 12, the substrate 1 surface of the silicon optoelectronic device 20 according to the present invention has a desired flection structure, i.e., the microdefect pattern 7 formed by the above-described processes. The microdefect pattern 7 may be formed to various shapes, in addition to a triangle (see FIG. 10) or a trapezoid (see FIG. 11).

The silicon optoelectronic device 20 according to the present invention as shown in FIG. 12 can be used as a light-emitting and/or receiving device since the p-n junction 8 between the doping region 10 and the substrate 1 has a quantum structure at which the creation and recombination of electrons-holes pairs occur.

That is, the silicon optoelectronic device 20 functions as a light-emitting device as follows. For example, if an electric power (voltage or current) is applied across the first and second electrodes 15 and 17, carriers, i.e., electrons and holes, are injected into the quantum wells of the p-n junction 8 and recombined (annihilated) at a subband energy level of the quantum wells. In this case, electro luminescence (EL) occurs at various wavelengths according to the recombination state of carriers, and only light of a specific wavelength band is amplified and output according to the period of the microdefect pattern 7. The quantity of light generated varies depending on the magnitude of the electric power (voltage or current) applied across the first and second electrodes 15 and 17.

The silicon optoelectronic device 20 also functions as a light-receiving device as follows. When only light of a specific wavelength band according to the period of the microdefect pattern 7 artificially formed is incident and photons are absorbed in the p-n junction 8 having the quantum wells, electrons and holes are excited at a subband energy level of the quantum wells formed at the p-n junction 8. Therefore, when an external circuit, for example, a load resistance (not shown) is connected to an output terminal, current proportional to the quantity of light received is output.

The silicon optoelectronic device 20 having the ultra-shallow doping region 10 as described above has high quantum efficiency since the quantum confinement effect occurs due to local variations in potential of charge distribution at the p-n junction 8 and a subband energy level is made in the quantum wells.

Figure 13:
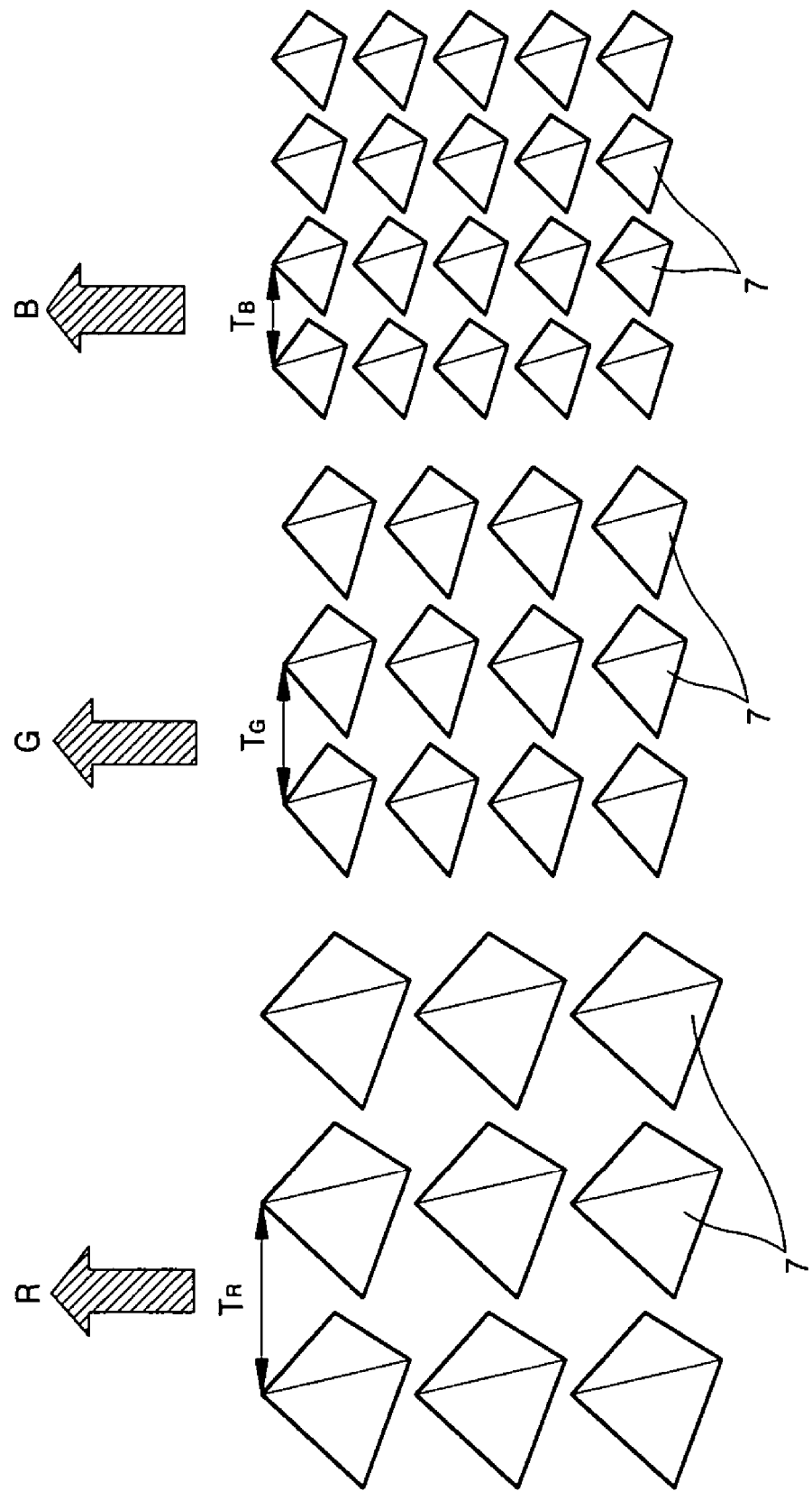
FIG. 13 depicts microdefect patterns having periods $T_R$, $T_G$, and $T_B$ respectively corresponding to a red light wavelength band, a green light wavelength band, and a blue light wavelength band, artificially formed along a surface of a substrate of a silicon optoelectronic device according to the present invention.

As shown in FIG. 13, according to the present invention, when the microdefect pattern 7 having desired periods, for example, periods $T_R$, $T_G$, and $T_B$ corresponding to a red light wavelength band R, a green light wavelength band G, and a blue light wavelength band B, respectively, are artificially formed along the surface of the substrate 1, the silicon optoelectronic device 20 capable of emitting and/or receiving light of desired specific wavelength bands, for example, red, green, and blue light can be obtained.

Figure 14:
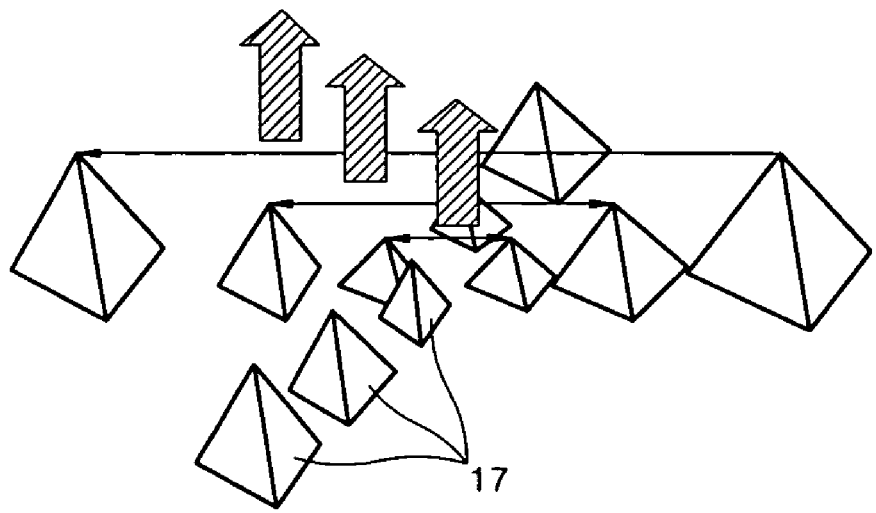
FIG. 14 depicts a microdefect pattern self-assembled along a surface of a substrate, like in U.S. patent application Ser. No. 10/122,421.

On the other hand, like in U.S. patent application Ser. No. 10/122,421, in the case of microdefects 17 self-assembled along a surface of a substrate, the microdefects have an irregular pattern, as shown in FIG. 14, thereby lowering the selectivity of wavelength bands.

Figure 15:
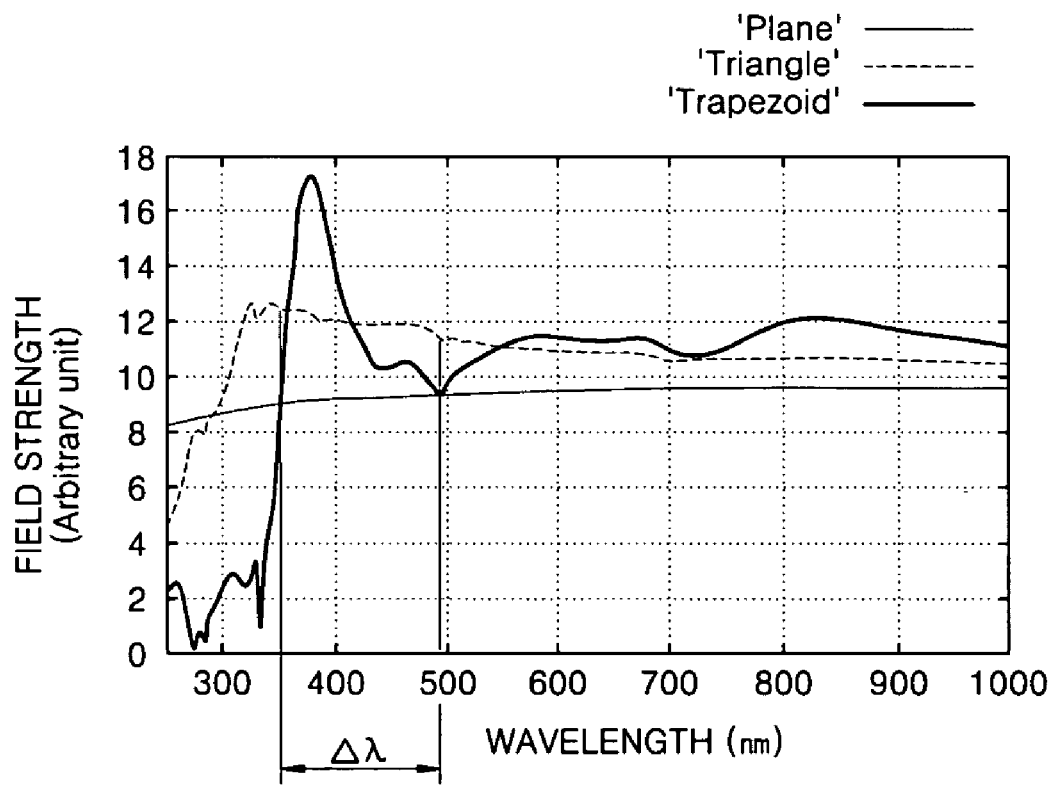
FIG. 15 is a graph showing simulation results of light emission characteristics of two silicon optoelectronic devices having respectively periodic triangular and trapezoidal microdefects formed along the surfaces of substrates as shown in FIGS. 10 and 11, and a microdefect-free silicon optoelectronic device, i.e., a silicon optoelectronic device having a planar substrate surface.

FIG. 15 is a graph showing simulation results of light emission characteristics of two silicon optoelectronic devices having respectively periodic triangular ('Triangle') and trapezoidal ('Trapezoid') microdefects 7' and 7" formed along the surfaces of substrates 1 as shown in FIGS. 10 and 11, and a microdefect-free silicon optoelectronic device, i.e., a silicon optoelectronic device having a plane substrate surface ('Plane'). Here, a silicon optoelectronic device having self-assembled irregular microdefects of various sizes exhibits similar light emission characteristics to the silicon optoelectronic device having the plane substrate surface.

In FIG. 15, a horizontal axis represents a generated light wavelength in nanometers (nm) and a vertical axis represents field strength of the generated light in an arbitrary unit.

As shown in FIG. 15, silicon optoelectronic devices having the microdefect pattern 7 artificially formed according to the present invention exhibit improved wavelength band selectivity and light-emitting efficiency, relative to otherwise silicon optoelectronic devices.

That is, as shown in FIG. 15, when microdefects artificially formed along the surface of a substrate have a specific shape and period, light-emitting efficiency of a specific wavelength band is greatly enhanced. If the period and size of the microdefects are changed, a peak (i.e., position of a wavelength band ($\Delta\lambda$)) that exhibits light-emitting efficiency exceeding a predetermined intensity) can shift and the size of the peak can also vary.

FIG. 15 shows the simulation results of two-dimensional microdefect pattern models as shown in FIGS. 10 and 11. In this regard, it is understood that a three-dimensional microdefect pattern can provide more enhanced wavelength band selectivity and light-emitting efficiency. That is, according to the present invention, a substrate having a two-dimensional microdefect pattern provides an emission amplification effect of more than 20 to 30%, relative to a substrate having a plane surface. Therefore, it is anticipated that when the microdefect pattern is optimized in three-dimensions, an emission amplification effect can be more than doubled.

As described above, when the microdefect pattern 7 is artificially formed to a desired shape and period along the surface of the substrate 1, good selection and amplification of a specific wavelength band can be ensured.

In the silicon optoelectronic device disclosed in U.S. patent application Ser. No. 10/122,421 as described above, the sizes of microdefects that determine wavelength selectivity cannot be easily controlled since the microdefects are self-assembled. In the case of microcavities spontaneously formed like in U.S. patent application Ser. No. 10/122,421, i.e., self-assembled microcavities, various microcavities of different wavelengths are easily mixed, and thus, it is difficult to settle the specific process conditions for wavelength selection.

However, according to the present invention, desired microcavities can be artificially formed at desired positions using very simple processes as shown in FIGS. 4A through 4E. Therefore, silicon optoelectronic devices of specific wavelength bands can be easily obtained, thereby improving uniformity and reproducibility.

In particular, according to the present invention, since regular microcavities can be formed along the surface of the silicon optoelectronic device 20, only light of a specific wavelength band can be filtered. Furthermore, such regular microcavities can lead to amplification of light of a specific wavelength band and attenuation of an unwanted wavelength band, unlike a conventional plane device surface or self-assembled irregular microdefects.

Hereinafter, as an illustrative example of apparatuses using the silicon optoelectronic device 20 of the present invention, an image input and/or output apparatus will be described.

Figure 16:
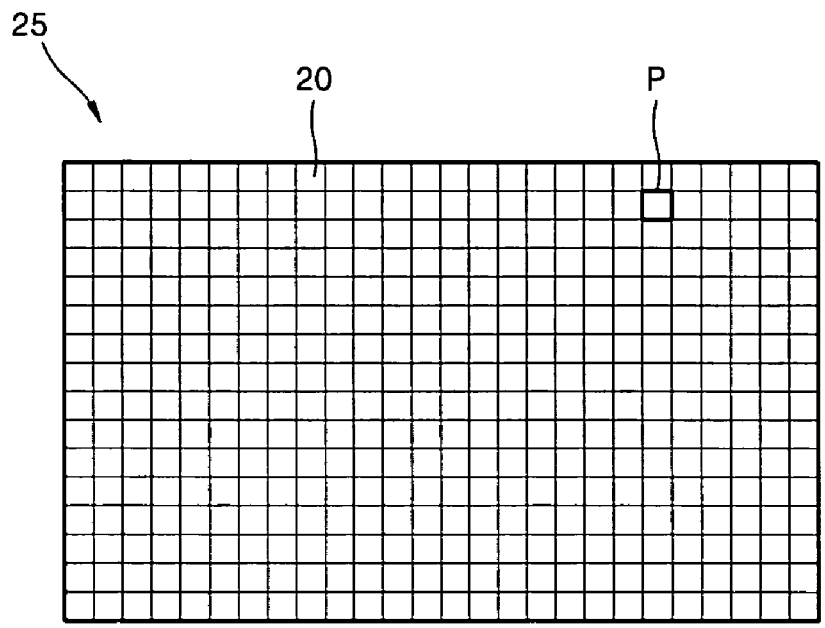
FIG. 16 is a schematic plan view of an image input and/or output apparatus according to a first embodiment of the present invention.

FIG. 16 is a schematic plan view of an image input and/or output apparatus according to a first embodiment of the present invention.

Referring to FIGS. 12 and 16, an image input and/or output apparatus according to the first embodiment of the present invention comprises a silicon optoelectronic device panel 25 having a two-dimensional array of silicon optoelectronic devices 20, each of which leads to input and/or output of an image, formed on an n- or p-type silicon-based substrate 1. The term, "image output" as used herein indicates substantially an image display. The term, "image input" as used herein indicates substantially generation of an electric image signal of an object photographed using a camera. The silicon optoelectronic devices 20 are described in the above, and thus, the overlapped descriptions thereof will be omitted.

As described above, each of the silicon optoelectronic devices 20 can be used as a light emitting and/or receiving device of a specific wavelength band or a plurality of wavelengths bands due to the creation and recombination of electron-hole pairs by the quantum confinement effect at the p-n junction 8 of the doping region 10.

Therefore, when a two-dimensional array of the silicon optoelectronic devices 20 is formed on the single substrate 1 through a series of semiconductor manufacture processes, the silicon optoelectronic device panel 25 capable of inputting and/or outputting an image can be obtained.

In this case, the first and second electrodes 15 and 17 are patterned on the substrate 11 used as a base of the silicon optoelectronic device panel 25 so that the input and/or output of an image can be performed on a pixel-by-pixel basis in the silicon optoelectronic device panel 25 to convert a photographed image into an electrical image signal and/or to display an image in two-dimensions.

Therefore, the silicon optoelectronic device panel 25 having a two-dimensional array of the silicon optoelectronic devices 20 can input and/or output an image in two-dimensions.

As described above, the wavelength of light absorbed or emitted in the silicon optoelectronic devices 20 is determined by microcavities due to the microdefect pattern 7 artificially formed along the surface of the substrate 1. In this regard, when the lengths of the microcavities inducing a desired wavelength and a resonance are designed so that amplification and/or absorption of desired wavelength light on a wafer is carried out, for example, on a pixel-by-pixel basis, the silicon optoelectronic device panel 25 having an array of the silicon optoelectronic devices 20 of desired light wavelength bands can be obtained.

In this case, when the sizes of the microcavities are constant, the silicon optoelectronic device 20 outputs and/or absorbs light of a specific wavelength. On the other hand, when the sizes of the microcavities are various, the silicon optoelectronic device 20 outputs and/or absorbs light of various wavelengths, for example, white light.

As mentioned above, the first and second electrodes 15 and 17 in the silicon optoelectronic device panel 25 having a two-dimensional array of the silicon optoelectronic devices 20 are patterned on the silicon-based substrate 1 in such a way that the input and/or output of an image can be performed on a pixel-by-pixel basis.

In an image input and/or output apparatus according to the present invention, the silicon optoelectronic device panel 25 may be formed in such a way that one of the silicon optoelectronic devices 125 corresponds to one pixel P, as shown in FIG. 16.

In this case, each of the silicon optoelectronic devices 20 may be designed to output and/or absorb light of a single wavelength or white light.

When each of the silicon optoelectronic devices 20 is designed to output and/or absorb light of a single wavelength or white light, an image input and/or output apparatus according to the present invention can display a monochromic image and/or generate an electrical monochromic image signal of a photographed object.

Figure 17:
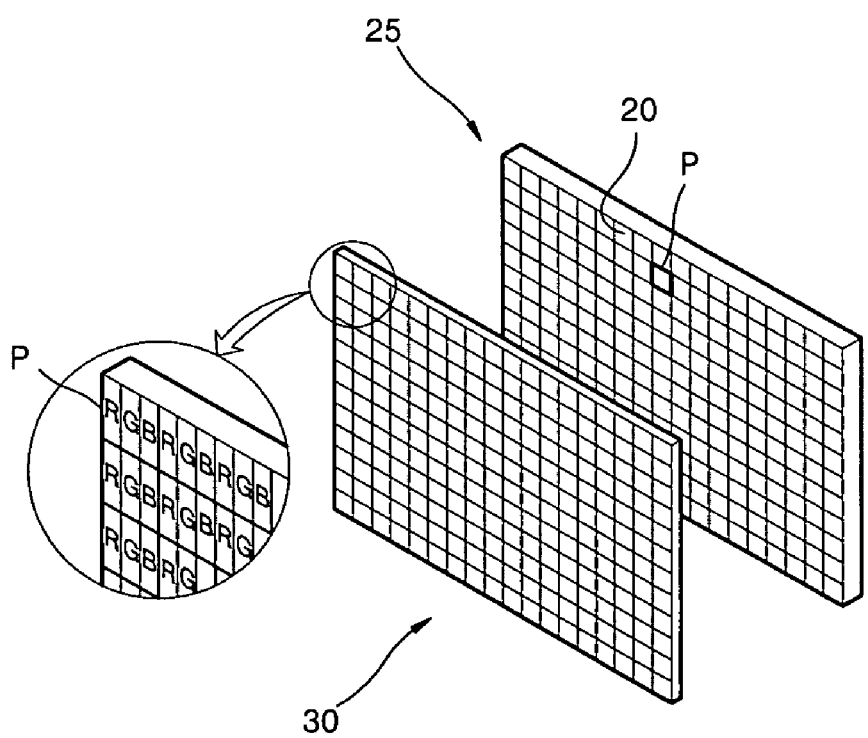
FIG. 17 is a schematic exploded perspective view of an image input and/or output apparatus according to a second embodiment of the present invention.

Meanwhile, an image input and/or output apparatus shown in FIG. 17 according to a second embodiment of the present invention comprises a silicon optoelectronic device panel 25 having a plurality of silicon optoelectronic devices 25, each of which outputs and/or absorbs white light. The image input and/or output apparatus further comprises a color filter 30, which is installed at the front (at the side for input and/or output of light) of the silicon optoelectronic device panel 25 to display a full-color image. Therefore, the image input and/or output apparatus can display a full-color image and/or generate an electrical full-color image signal for a full color of a photographed object.

Figure 18:
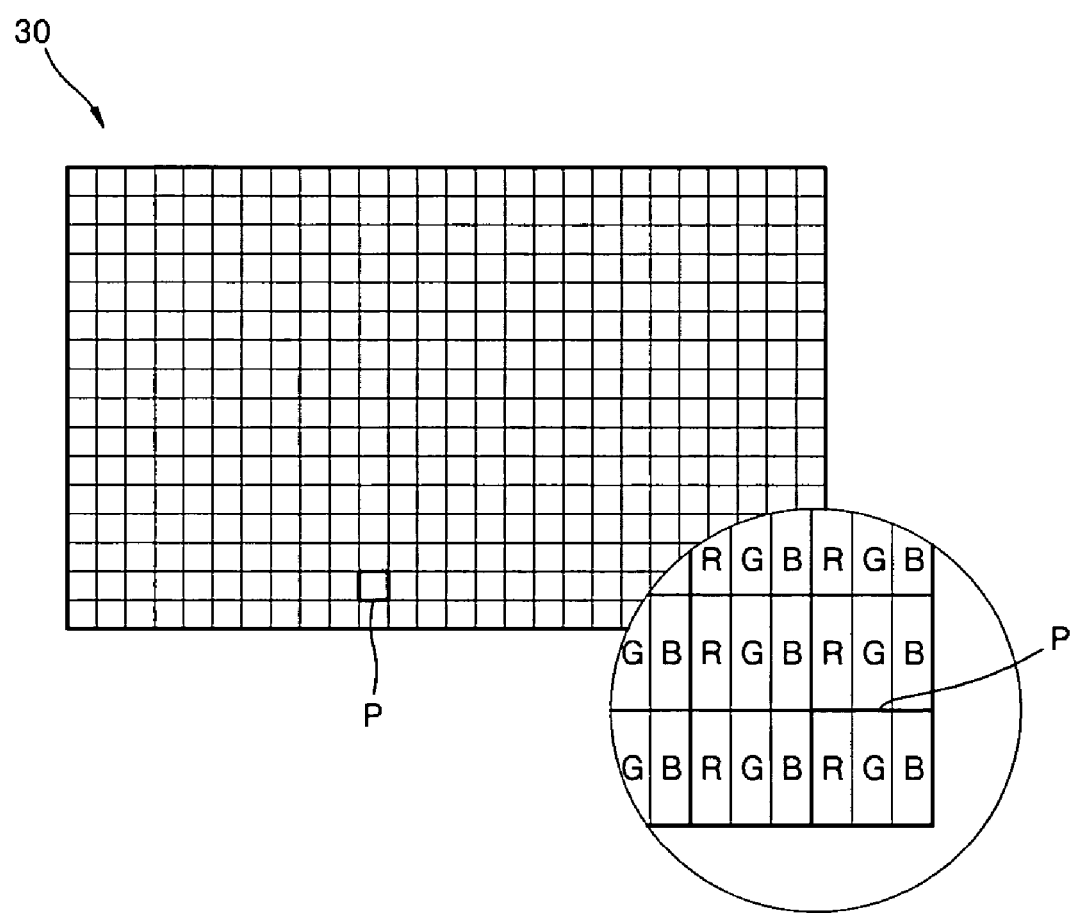
FIG. 18 is a schematic plan view of the structure of a color filter in the image input and/or output apparatus shown in FIG. 17.

In this case, the color filter 30 is designed in such a way that all R, G, and B color components correspond to each pixel P, as shown in FIG. 18.

The arrangement of the R, G, and B color components of the color filter 30 is similar to a two-dimensional array of silicon optoelectronic devices in a silicon optoelectronic device panel 40 (FIG. 19) according to another embodiment of the present invention as will be described later. Various changes may be made to the arrangement of the R, G, and B color components in the color filter 30.

In this way, an image input and/or output apparatus including the color filter 30 at the front of the silicon optoelectronic device panel 25 according to the second embodiment of the present invention can input and/or output a color image. That is, this apparatus makes it possible to convert a photographed image into an electrical color image signal and/or to display a full color image according to the electrical color image signal.

Figure 19:
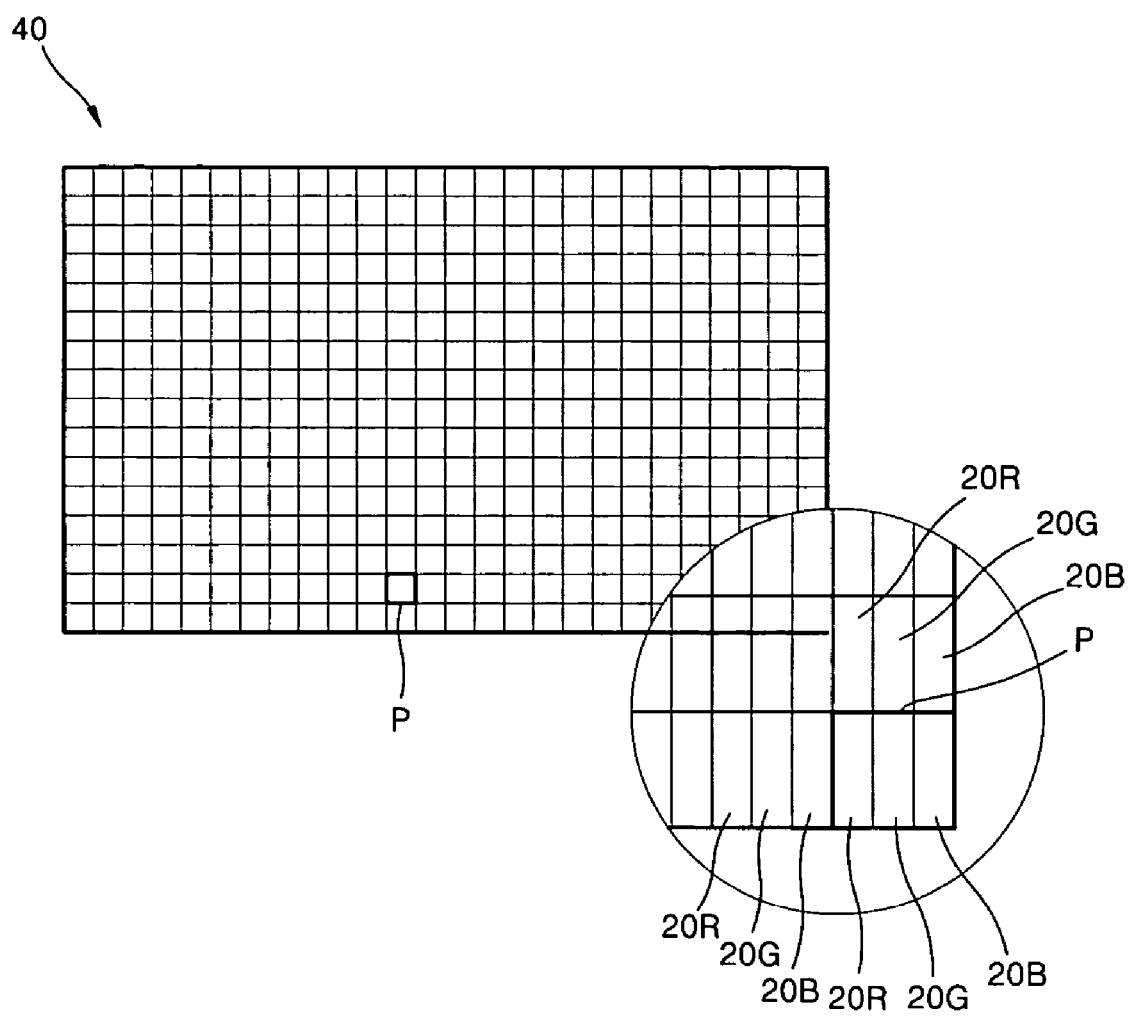
FIG. 19 is a schematic plan view of an image input and/or output apparatus according to a third embodiment of the present invention.

FIG. 19 is a schematic view of an image input and/or output image apparatus according to a third embodiment of the present invention.

In an image input and/or output apparatus according to the third embodiment of the present invention, the silicon optoelectronic device panel 40 is designed in such a way that three or more silicon optoelectronic devices correspond to each pixel P. FIG. 19 shows an example of the silicon optoelectronic device panel 40 having three silicon optoelectronic devices 20R, 20G, and 20B per each pixel P.

In this case, the three silicon optoelectronic devices 20R, 20G, and 20B corresponding to each pixel P output and/or absorb red light R, green light G, and blue light B (for example), respectively and then convert the detected color light into respective electrical color image signals. The three silicon optoelectronic devices 20R, 20G, and 20B have microdefect pattern of different periods corresponding to specific wavelength bands, for example, red light R, green light G, and blue light B. The arrangements and used materials of other constitutional elements of the three silicon optoelectronic devices 20R, 20G, and 20B are the same as those of the silicon optoelectronic devices 20 according to the present invention described above.

The silicon optoelectronic device panel 40 according to the third embodiment of the present invention as shown in FIG. 19 can display a color image without using a separate color filter.

The color filter 30 as shown in FIG. 18 may be positioned at the front of the silicon optoelectronic device panel 40 in order to represent more distinct color image.

Various changes may be made with respect to color arrangement of the three silicon optoelectronic devices 20R, 20G, and 20B outputting and/or absorbing light of three wavelengths per each pixel and/or arrangement of the R, G, B components in the color filter 30.

As described above, various changes may be made with respect to input and/or output of an image in an image input and/or output apparatus according to the present invention that can input and/or output a monochromic or color image. These changes can be accomplished by varying the structure of a circuit controlling the input and/or output of an image.

Figure 20:
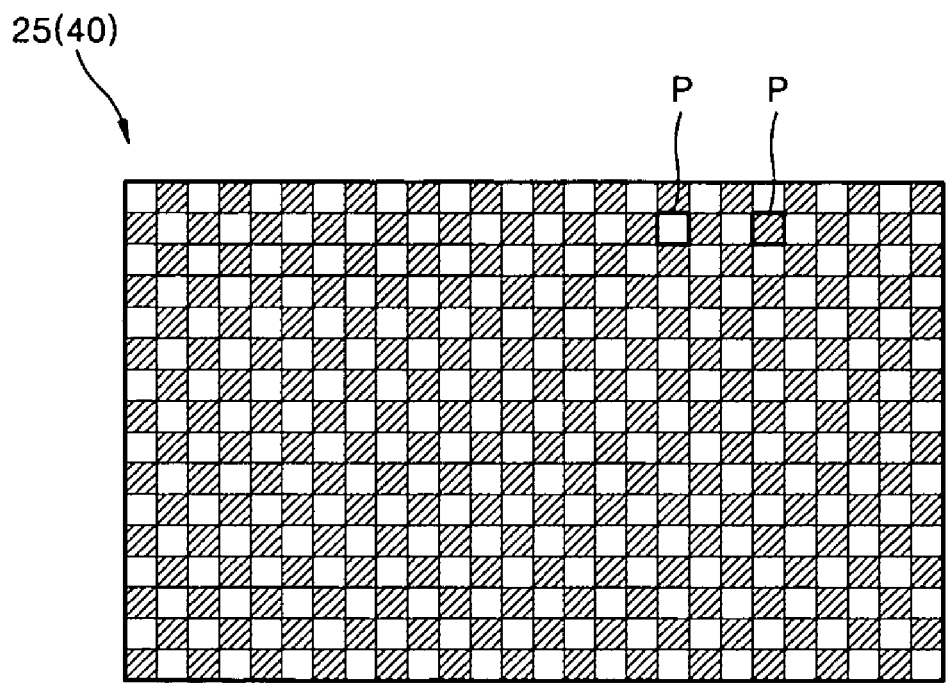
FIG. 20 is a schematic view of an embodiment of an image input and/or output apparatus according to the present invention in an aspect of image input and output.

That is, an image input and/or output apparatus according to the present invention can input and output an image using image input pixels and image output pixels that are alternately arranged, as shown in FIG. 20. In FIG. 20, pixels represented by oblique lines are image input pixels, i.e., pixels in which the silicon optoelectronic devices 20 according to the present invention are used as light-receiving devices. On the other hand, pixels represented by empty squares are image output pixels, i.e., pixels in which the silicon optoelectronic devices 20 according to the present invention are used as light-emitting devices.

As shown in FIG. 20, an image input and/or output apparatus according to the present invention may be formed in such a way that some of the silicon optoelectronic devices 20 of the silicon optoelectronic device panel 25 or 40 input an image and the others of the silicon optoelectronic devices output an image.

The image input pixels and the image output pixels may have various arrangements. For example, pixels positioned at predetermined areas of the silicon optoelectronic device panel 25 or 40 can be used as the image input pixels and the other pixels can be used as the image output pixels.

Since the silicon optoelectronic devices 20 can be used as light-emitting and/or receiving devices, the image input pixels and the image output pixels can be switched when needed in an image input and/or output apparatus according to the present invention in which the input and output of an image are carried out by different silicon optoelectronic devices 20 as shown in FIG. 20. The number of the image input pixels and the image output pixels may also be altered. Such alteration can be accomplished by appropriately designing the driving and/or control circuits and algorism of an image input and/or output apparatus according to the present invention.

Figure 21A:
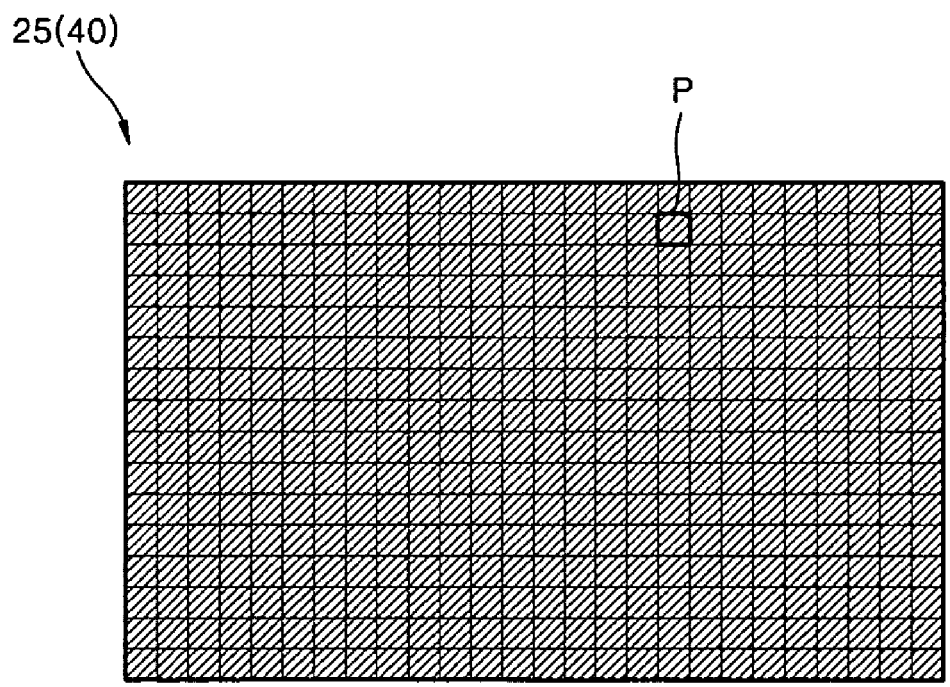
FIGS. 21A and 21B are schematic views of another embodiment of an image input and/or output apparatus according to the present invention in an aspect of image input and output.
Figure 21B:
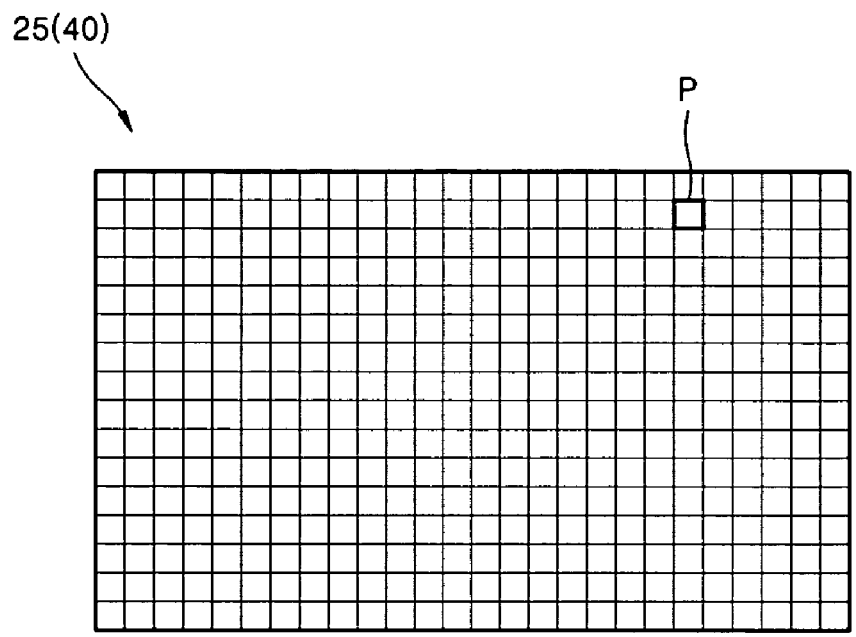

An image input and/or output apparatus according to the present invention may also be formed in such a way that the input and output of an image can be carried out by the same silicon optoelectronic device with a time difference, as shown in FIGS. 21A and 21B. FIG. 21A shows an image input state of the silicon optoelectronic device panel 25 or 40 of an image input and/or output apparatus according to the present invention and FIG. 21B shows an image output state of the silicon optoelectronic device panel 25 or 40 of an image input and/or output apparatus according to the present invention.

Each pixel of the silicon optoelectronic device panel 25 or 40 shown in FIGS. 20, 21A, and 21B may correspond to one silicon optoelectronic device 20 (see FIGS. 16 and 17) or to three or more silicon optoelectronic devices 20R, 20B, and 20C (see FIG. 19).

While an image input and/or output apparatus according to the present invention has been particularly shown and described with reference to exemplary embodiments thereof, various changes thereof may be made therein without departing from the scope of the present invention.

Since an image input and/or output apparatus according to the present invention as described above can directly input optical information in a screen, it can be used in equipment requiring interactive visual communications and/or bidirectional information transmission such as computer monitors, televisions, in particular, digital televisions, and handheld terminals.

In this case, since an image input and/or output apparatus according to the present invention allow for input and output of an image in a single panel, using a separate camera is eliminated upon visual communications.

Handheld terminals may be various types of portable communication equipment such as mobile phones and personal digital assistants (PDAs).

Furthermore, an image input and/or output apparatus according to the present invention can input and output an image in a single panel, and thus, a full face of an operator can be photographed and transmitted. Therefore, vividness in visual communications is enhanced.

Up until now, the present invention has been described with a view to an image input and/or output apparatus comprising a single silicon optoelectronic device panel having a two-dimensional array of silicon optoelectronic devices, but is not limited thereto. That is, an image input and/or output apparatus according to the present invention may comprise combinations of a plurality of silicon optoelectronic device panels to provide a larger screen.

Figure 22:
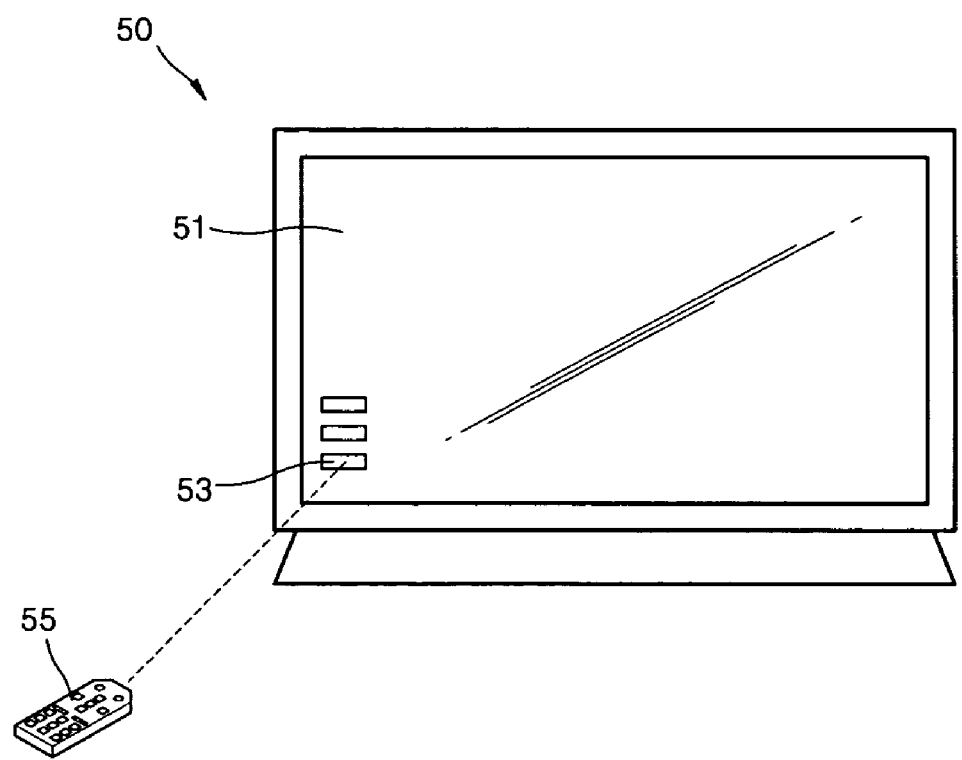
FIG. 22 is a schematic view of a digital television using an image input and/or output apparatus according to the present invention.

FIG. 22 shows a digital television using an image input and/or output apparatus according to the present invention.

Referring to FIG. 22, an image input and/or output apparatus according to the present invention can be used in a digital television 50 which allows for input of information into a screen 51 and selection of a menu using an optical wireless remote controller 55. The optical wireless remote controller 55 can irradiate light only in a specific region like an optical pointer. When an optical signal is irradiated onto a specific region within the screen 51, for example, a predetermined menu 53, from the optical wireless remote controller 55, a silicon optoelectronic device, which is positioned in the specific region and serves as a light-receiving device, receives the optical signal. According to the received optical signal, changing channels of the digital television 50 or working on the Internet is possible.

In addition, an image input and/or output apparatus of the present invention can be applied in various equipments requiring bi-directional information transmission.

As is apparent from the above description, a silicon optoelectronic device according to the present invention has superior light-emitting efficiency to a conventional light-emitting device using silicon, can be used as at least one of a light-emitting device and a light-receiving device, and has high wavelength selectivity.

In addition, a silicon optoelectronic device panel having a two-dimensional array of silicon optoelectronic devices according to the present invention can be applied in an image input and/or output apparatus capable of directly displaying an image and/or inputting optical information in a screen.

In particular, since a silicon optoelectronic device according to the present invention can be used as both of a light-emitting device and a light-receiving device, an image input and output apparatus for bidirectional information transmission that can display an image and input an image or optical information in a single panel can be produced.

Using an image input and/or output apparatus according to the present invention eliminates use of a separate camera upon visual communication, thereby enhancing vividness in visual communications. When an image input and/or output apparatus according to the present invention is used in a digital television, direct selection of a menu using an optical wireless remote controller is possible.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a silicon optoelectronic device comprising: preparing an n- or p-type silicon-based substrate;
   forming a microdefect pattern along a surface of the substrate by etching;
   forming a control film with an opening on the microdefect pattern; and
   forming a doping region on the surface of the substrate having the microdefect pattern in such a way that a predetermined dopant of the opposite type to the substrate is injected onto the substrate through the opening of the control film to be doped to a depth so that a photoelectric conversion effect leading to light emission and/or reception by quantum confinement effect in a p-n junction occurs.

2. The method according to claim 1, wherein forming the microdefect pattern comprises:
   forming a mask layer on the surface of the substrate;
   forming openings of a desired size and period in the mask layer;
   etching the surface of the substrate corresponding to the openings of the mask layer to form the microdefect pattern along the surface of the substrate; and removing the mask layer.

3. The method according to claim 2, wherein forming the openings of a desired size and period in the mask layer is carried out using a single probe- or a multi-probe having an array of a plurality of probes.

4. The method according to claim 3, wherein the probe is an atomic force microscopy (AFM) probe.

5. The method according to claim 1, wherein the control film is a silicon oxide film to allow the doping region to be formed to the depth such that a photoelectrical conversion effect by quantum confinement in the p-n junction 30 between the doped region and the substrate occurs.

6. The method according to claim 1, further comprising forming first and second electrodes on the substrate to be electrically connected to the doping region.

7. The method according to claim 1, wherein forming the doping region is carried out by non-equilibrium diffusion of the predetermined dopant.

8. The method according to claim 1, wherein the control film is selectively removed after the formation of the doping region.

9. The method according to claim 1, wherein the microdefect pattern has a period corresponding to the wavelength of light emitted and/or received.

10. The method according to claim 9, wherein the microdefect pattern is formed to a single period to emit and/or receive light of a single wavelength.

11. The method according to claim 10, wherein when the control film is formed with a plurality of openings on the microdefect pattern and a plurality of doping regions are formed through the openings, an array of a plurality of silicon optoelectronic devices is formed.

12. The method according to claim 9, wherein when the microdefect pattern is formed to a plurality of microdefect pattern regions having different periods, the control film is formed with a plurality of openings corresponding to the periods, and a plurality of doping regions are formed through the openings, an array of a plurality of silicon optoelectronic devices that emit and/or receive light of a plurality of wavelengths is formed.

13. A silicon optoelectronic device manufactured by the method according to claim 1.

14. The silicon optoelectronic device according to claim 13, wherein the microdefect pattern has a period corresponding to the wavelength of light emitted and/or received.

15. The silicon optoelectronic device according to claim 14, wherein the microdefect pattern is formed to a single period to emit and/or receive light of a single wavelength.

16. The silicon optoelectronic device according to claim 14, wherein when the microdefect pattern is formed to a plurality of microdefect pattern regions having different periods, the control film is formed with a plurality of openings corresponding to the periods, and a plurality of doping regions are formed through the openings, an array of a plurality of silicon optoelectronic devices that emit and/or receive light of a plurality of wavelengths is formed.

17. The silicon optoelectronic device according to claim 13, wherein the control film is selectively removed after the formation of the doping region.

18. A silicon optoelectronic device manufactured by the method according to claim 2.

19. The silicon optoelectronic device according to claim 18, wherein the microdefect pattern has a period corresponding to the wavelength of light emitted and/or received.

20. The silicon optoelectronic device according to claim 19, wherein the microdefect pattern is formed to a single period to emit and/or receive light of a single wavelength.

21. The silicon optoelectronic device according to claim 19, wherein when the microdefect pattern is formed to a plurality of microdefect pattern regions having different periods, the control film is formed with a plurality of openings corresponding to the periods, and a plurality of doping regions are formed through the openings, an array of a plurality of silicon optoelectronic devices that emit and/or receive light of a plurality of wavelengths is formed.

22. The silicon optoelectronic device according to claim 18, wherein the control film is selectively removed after the formation of the doping region.

23. A silicon optoelectronic device manufactured by the method according to claim 6.

24. The silicon optoelectronic device according to claim 23, wherein the microdefect pattern has a period corresponding to the wavelength of light emitted and/or received.

25. The silicon optoelectronic device according to claim 24, wherein the microdefect pattern is formed to a single period to emit and/or receive light of a single wavelength.

26. The silicon optoelectronic device according to claim 24, wherein when the microdefect pattern is formed to a plurality of microdefect pattern regions having different periods, the control film is formed with a plurality of openings corresponding to the periods, and a plurality of doping regions are formed through the openings, an array of a plurality of silicon optoelectronic devices that emit and/or receive light of a 15 plurality of wavelengths is formed.

27. The silicon optoelectronic device according to claim 23, wherein the control film is selectively removed after the formation of the doping region.

* * * * *